United States Patent [19]

Russell

[11] Patent Number: 4,833,563
[45] Date of Patent: May 23, 1989

[54] MOLDED CASE CIRCUIT BREAKER ACTUATOR-ACCESSORY MODULE

[75] Inventor: Ronald R. Russell, Plainville, Conn.

[73] Assignee: General Electric Company, New York, N.Y.

[21] Appl. No.: 176,589

[22] Filed: Apr. 1, 1988

[51] Int. Cl.⁴ .............................................. H02H 3/08
[52] U.S. Cl. ...................................... 361/92; 361/93; 361/115; 361/187
[58] Field of Search ....................... 361/54, 55, 56, 57, 361/86, 87, 92, 93, 115, 187

[56] References Cited

U.S. PATENT DOCUMENTS

| | | | |
|---|---|---|---|
| 4,016,518 | 4/1977 | Lang et al. | 335/7 |
| 4,025,823 | 5/1977 | Lang et al. | 361/111 |
| 4,205,361 | 5/1980 | Shimp | 361/92 |
| 4,348,709 | 9/1982 | Mauk et al. | 361/92 |
| 4,352,138 | 9/1982 | Gilken | 361/93 X |
| 4,354,216 | 10/1982 | Volta | 361/92 |
| 4,589,052 | 5/1986 | Dougherty | 361/94 |
| 4,622,444 | 11/1986 | Kandatsu et al. | 200/303 |
| 4,641,117 | 2/1987 | Willard | 335/7 |
| 4,679,019 | 7/1987 | Todaro et al. | 335/172 |
| 4,700,161 | 10/1987 | Todaro et al. | 335/172 |
| 4,706,158 | 11/1987 | Todaro et al. | 361/92 |
| 4,728,914 | 3/1988 | Morris et al. | 335/6 |

FOREIGN PATENT DOCUMENTS

1370942 10/1974 United Kingdom .
2033177 5/1980 United Kingdom .

Primary Examiner—Derek S. Jennings
Attorney, Agent, or Firm—Richard A. Menelly; Walter C. Bernkopf; Fred Jacob

[57] ABSTRACT

An integrated protection unit is a circuit breaker which includes basic overcurrent protection facility along with selective electrical accessories. A molded plastic accessory access cover secured to the integrated protection unti cover protects the accessory components contained within the integrated protection unit cover from the environment. A combined overcurrent trip actuator and multiple accessory module is either field-installed or factory-installed within the integrated protection unit. A separate actuator-accessory module is selected for different combinations of accessory functions.

40 Claims, 6 Drawing Sheets

MOLDED CASE CIRCUIT BREAKER ACTUATOR-ACCESSORY MODULE

BACKGROUND OF THE INVENTION

The trend in the circuit protection industry is currently toward complete circuit protection which is accomplished by the addition of supplemental protection apparatus to standard overcurrent protective devices, such as molded case circuit breakers. U.S. Pat. 4,622,444 entitled "Circuit Breaker Housing and Attachment Box" describes an accessory that can be field-installed within a circuit breaker without interfering with the integrity of the circuit breaker internal components. This is accomplished by mounting the accessories within a recess formed in the circuit breaker enclosure cover.

An electronic trip actuator which is mounted within the circuit breaker enclosure is described within U.S. Pat. No. 4,679,019 entitled "Trip Actuator for Molded Case Circuit Breakers". The circuit breaker actuator responds to trip signals generated by an electronic trip unit completely contained within a semi-conductor chip such as that described within U.S. Pat. No. 4,589,052. The development of a combined trip actuator for both overcurrent protection as well as accessory function is found within U.S. Pat. No. 4,700,161 entitled Trip Unit and Accessory Module for Electronic Trip Circuit Breakers". The aforementioned U.S. Patents which represent the advanced state of the art of circuit protection devices are incorporated herein for reference purposes.

A shunt trip accessory unit allows the circuit breaker operating mechanism to be articulated to separate the circuit breaker contacts, usually to perform a tripping function for electrical system control and protection. One such shunt trip accessory unit is described within U.S. patent application Ser. No. 133,867 filed Dec. 16, 1987 entitled "Molded Case Circuit Breaker Shunt Trip Unit". An auxiliary switch accessory unit allows an operator to determine the "ON" or "OFF" conditions of a molded case circuit breaker contacts at a remote location by means of an audible alarm or visible display. One such auxiliary switch unit is described within U.S. patent application Ser. No. 133,868 filed Dec. 16, 1987 entitled "Molded Case Circuit Breaker Auxiliary Switch Unit". Both of the aforementioned U.S. Patent Applications are incorporated herein for purposes of reference.

One example of an undervoltage release circuit is found within United Kingdom patent application 2,033,177A entitled "Circuit Breaker with Undervoltage Release". The circuit described within this Application applies a large initial current pulse to the undervoltage release coil to drive the plunger against the bias of a powerful compression spring and uses a ballast resistor to limit the holding current to the undervoltage release coil to a lower value. It is believed that the heat generated within this circuit would not allow the circuit to be contained within the confines of the circuit breaker enclosure.

A more recent example of a combined overcurrent trip actuator and multiple accessory unit is described within U.S. patent application Ser. No. 133,869 filed Dec. 16, 1987 entitled "Molded Case Circuit Breaker Multiple Accessory Unit" which combined overcurrent trip actuator and multiple accessory unit requires a separate mounting recess within the circuit breaker cover to house the printed wire board that carries the accessory control circuit. U.S. patent application Ser. No. 163,589 entitled "Molded Case Circuit Breaker Actuator-Accessory Unit" describes one such combined overcurrent trip actuator and multiple accessory unit wherein the printed wire board and actuator-accessory unit are both contained within the same mounting recess within the circuit breaker cover. Both of the aforementioned U.S. patent applications are incorporated herein for purposes of reference.

SUMMARY OF THE INVENTION

An integrated protection unit which includes overcurrent protection along with auxiliary accessory function within a common enclosure contains an accessory cover for access to the selected accessory modules to allow field installation of the accessory modules. A combined actuator-accessory module provides overcurrent along with undervoltage release and/or shunt trip functions and is arranged along with the printed wire board containing the accessory control circuit within one part of the enclosure. A separate module is required for overcurrent with undervoltage protection; overcurrent with shunt trip; and overcurrent with both shunt trip along with undervoltage protection.

DESCRIPTION OF THE PREFERRED EMBODIMENT

Figure 1:
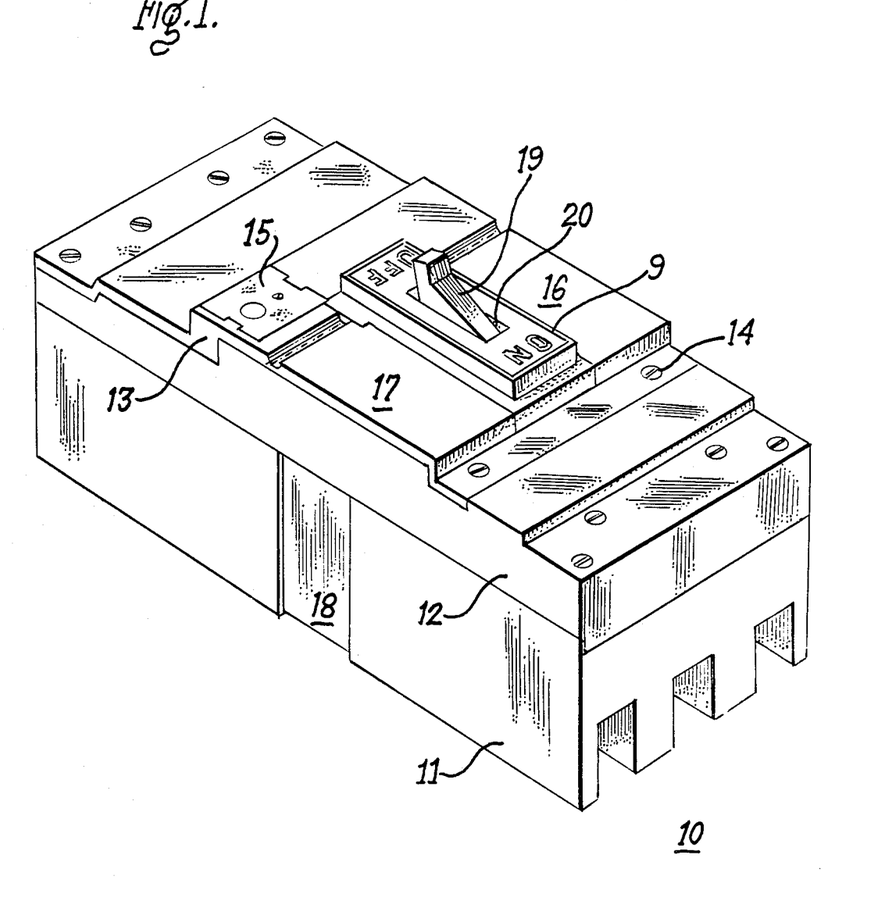
FIG. 1 is a top perspective view of an integrated molded case circuit breaker containing selected accessory functions.

An integrated circuit breaker 10 consisting of a molded plastic case 11 with a molded plastic cover 12 is shown in FIG. 1 with the accessory cover 13 attached to the circuit breaker cover by means of screws 14. The case includes a wiring slot 18 formed therein for allowing external connection with a remote switch or alarm. The circuit breaker operating handle 19 extends up from an access slot 20 formed in the cover escutcheon 9. A rating plug 15 such as described in U.S. Pat. No. 4,728,914 entitled "Rating Plug Enclosure for Molded Case Circuit Breakers", which Patent Application is incorporated herein for reference purposes is shown assembled within the accessory cover. A pair of accessory doors 16, 17 are formed in the accessory cover for providing access to the combined electromagnetic actuator and multiple accessory module 31, hereafter "actuator-accessory module" contained within the recess 40, shown in FIG. 2. Still referring to FIG. 2, the rating plug 15 is fitted within a recess 23 formed in the accessory cover 13 and the accessory cover is fastened to the circuit breaker cover by means of screws 14, thru-holes 24 and threaded openings 25. Access to the rating plug interior for calibration purposes is made by means of the rating plug access hole 21.

Figure 2:
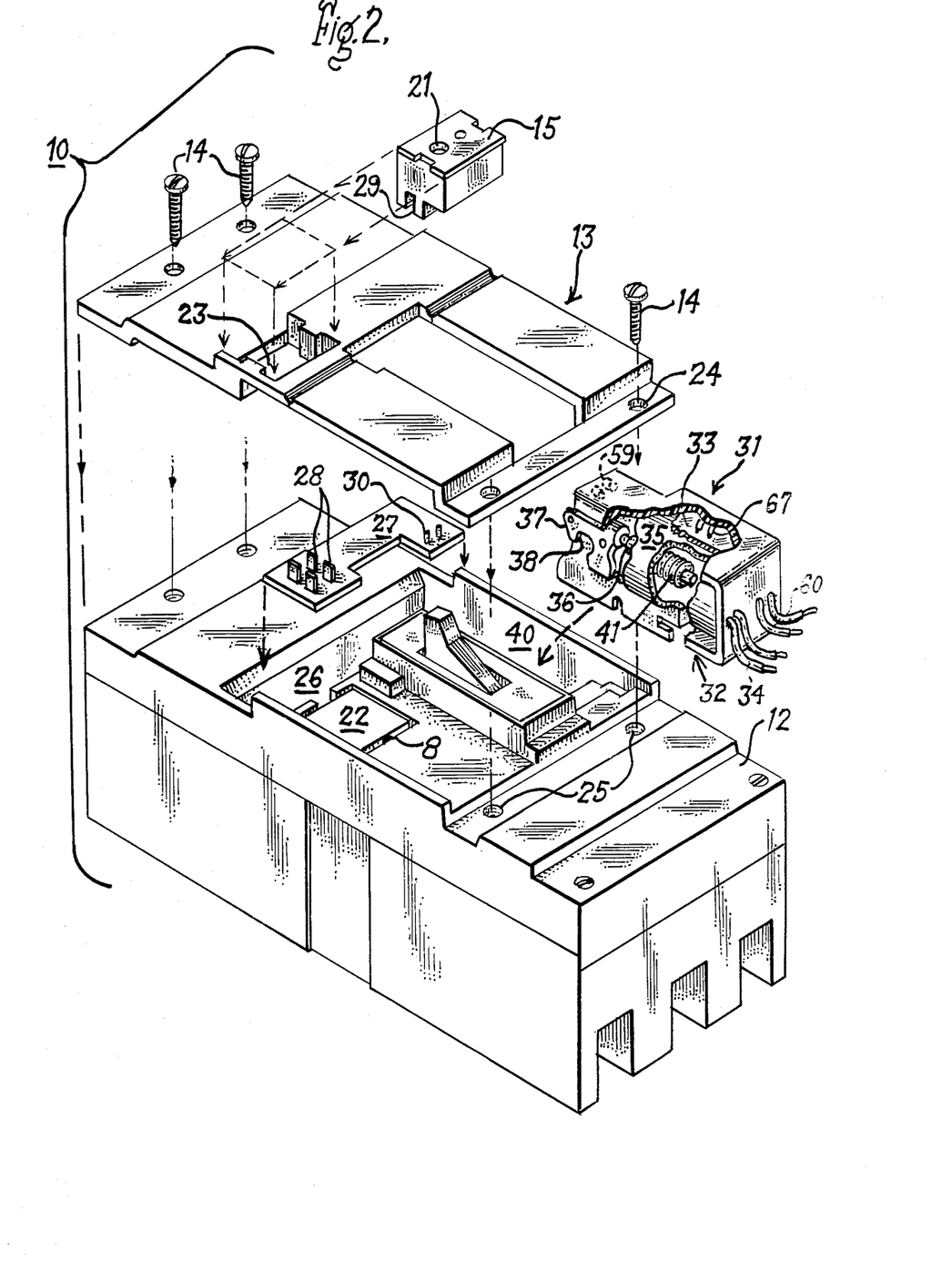
FIG. 2 is an exploded top perspective view of the integrated circuit breaker of FIG. 1 prior to assembly of the combined actuator-accessory module according to the invention.

The trip unit for the integrated circuit breaker 10 is contained within a printed wire board 27 which is positioned in the trip unit recess 26. The rating plug 15 when inserted within the rating plug recess interconnects with the printed wire board by means of pins 28 upstanding from the printed wire board and sockets 29 formed on the bottom of the rating plug. An auxiliary switch 22 is positioned within the auxiliary switch recess 8 and is similar to that described in aforementioned U.S. patent application Ser. No. 133,868 filed Dec. 16, 1987 entitled "Molded Case Circuit Breaker Auxiliary Switch Unit". When the auxiliary switch and trip unit printed wire board have been assembled within their appropriate recesses, the actuator-accessory module 31 is then installed within recess 40. The actuator-accessory module includes a housing 32 within which the actuator-accessory coil 35 is enclosed and which further contains a plunger 36 and a plunger spring 41 which projects the plunger in a forward trip position against the holding force provided by the energized actuator-accessory coil 35. The actuator-accessory module is similar to the actuator-accessory unit described within aforementioned U.S. patent application Ser. No. 163,589 wherein a trip actuator latch 37 is pivotally attached to the housing 32. A hook 38 formed at one end of the trip actuator latch cooperates with the circuit breaker operating mechanism shown in aforementioned U.S. Pat. No. 4,700,161 in the manner to be described below in greater detail. The operation of the actuator-accessory module is similar to that described within U.S. Pat. Nos. 4,641,117 and 4,679,019 which Patents are incorporated herein for purposes of reference. The actuator-accessory module includes a printed wire board 33 which contains the components required for operating the actuator-accessory coil 35 and is connected with a pair of pins 30 upstanding from the trip unit printed wire board 27 by means of edge connectors 59 which are connected to the actuator-accessory printed wire board 33. A pair of wire conductors 34 connect the actuator-accessory module with a voltage source when undervoltage protection is desired and a separate pair of wire conductors 60 connect with a voltage source when a shunt trip function is desired. The actuator-accessory coil 35 internally connects with the actuator-accessory printed wire board 33 by means of a separate pair of wire conductors 67, as indicated.

Figure 3:
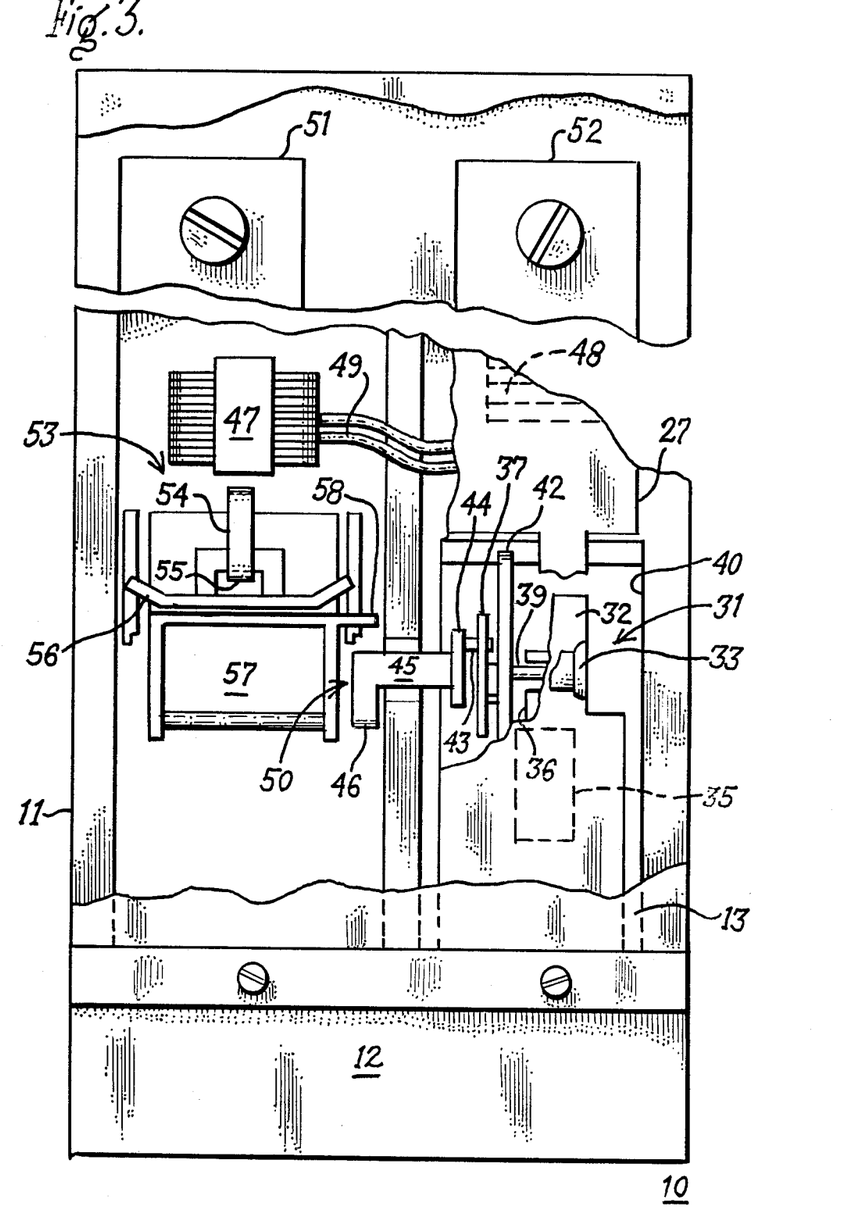
FIG. 3 is a plan view of the integrated molded case circuit breaker with part of the cover removed to show the interaction between the circuit breaker operating mechanism and the combined actuator-accessory module.

The actuator-accessory module 31 is depicted in FIG. 3 within the recess 40 in the integrated circuit breaker 10 with part of the actuator-accessory module printed wire board 33, actuator-accessory module housing 32 and accessory cover 13 removed to show the interaction between the actuator-accessory module 31 and the mechanical actuator 50 which sits in the integrated circuit breaker case 11. The integrated circuit breaker operating mechanism shown generally at 53 includes an operating cradle 54 having a hook 55 formed at one end thereof which is retained by means of a primary latch 56. The secondary latch assembly 57 prevents the primary latch from releasing the operating cradle until the secondary latch is displaced. A tab 58 extending from the secondary latch is contacted by the operation of the mechanical actuator 50 to displace the secondary latch and thereby articulate the circuit breaker operating mechanism in response to a trip command in the following manner. Electric current flow is sensed by a pair of current transformers 47, 48 which are located ahead of load lugs 51, 52. The current transformers connect with the trip unit printed wire board 27 (FIG. 2) by means of conductors 49. The operating lever 46 sits within the case 11 and connects with the latch support arm 44 in the actuator-accessory module recess 40 by means of a connecting arm 45. The latch pin 43 is retained by the trip actuator latch 37 which is in turn controlled by the position of the trip actuator arm 39 which extends through a side wall 42 of the actuator-accessory module housing 32. The trip actuator arm 39 interfaces with the plunger 36 in the following manner. When the circuit current exceeds a predetermined value, the holding current to the actuator-accessory coil 35 is interrupted thereby allowing the plunger 36 to be propelled by the urgence of the plunger spring (FIG. 2) to thereby rotate the trip actuator latch 37 in the clockwise direction to release the trip actuator latch 37 from the latch pin 43.

Figure 4:
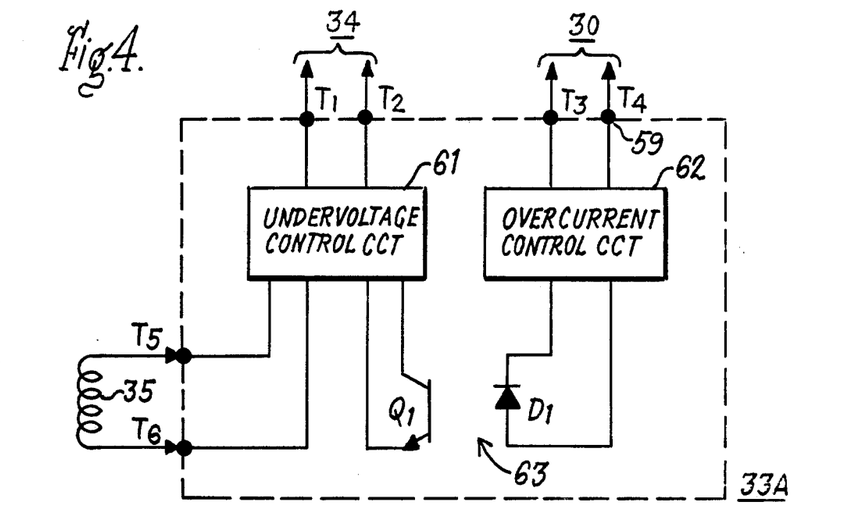
FIG. 4 is a circuit diagram of one embodiment of the electrical circuit contained within the printed wire board on the actuator-accessory module of FIG. 2.

When undervoltage release function is required along with overcurrent protection, the circuit depicted at 33A in FIG. 4 is incorporated within the actuator-accessory printed wire board 33 shown earlier in FIGS. 2 and 3. The actuator-accessory coil 35 is connected with the circuit 33A by means of terminals T5, T6 and is connected with the remote voltage source over conductors 34 by means of terminals $T_1$, $T_2$. The undervoltage control circuit 61 is similar to that described in aforementioned U.S. patent application Ser. No. 133,869 and provides a holding current to the actuator-accessory coil 35 until the voltage supplied to terminals $T_1$, $T_2$ drops to a predetermined value, at which time the holding current is interrupted and the trip function is initiated, as described earlier. The overcurrent trip function is provided by means of the overcurrent control circuit 62 which interacts with the undervoltage control circuit 61 by means of the opto-isolator 63 consisting of the light-emitting diode $D_1$ and the phototransistor $Q_1$. The overcurrent control circuit connects with the trip unit printed wire board 27 of FIG. 2 by means of terminals $T_3$, $T_4$ which comprise edge connectors 59. The edge connectors connect with the trip unit printed wire board 27 of FIG. 2 by means of pins 30, as described earlier.

Figure 6:
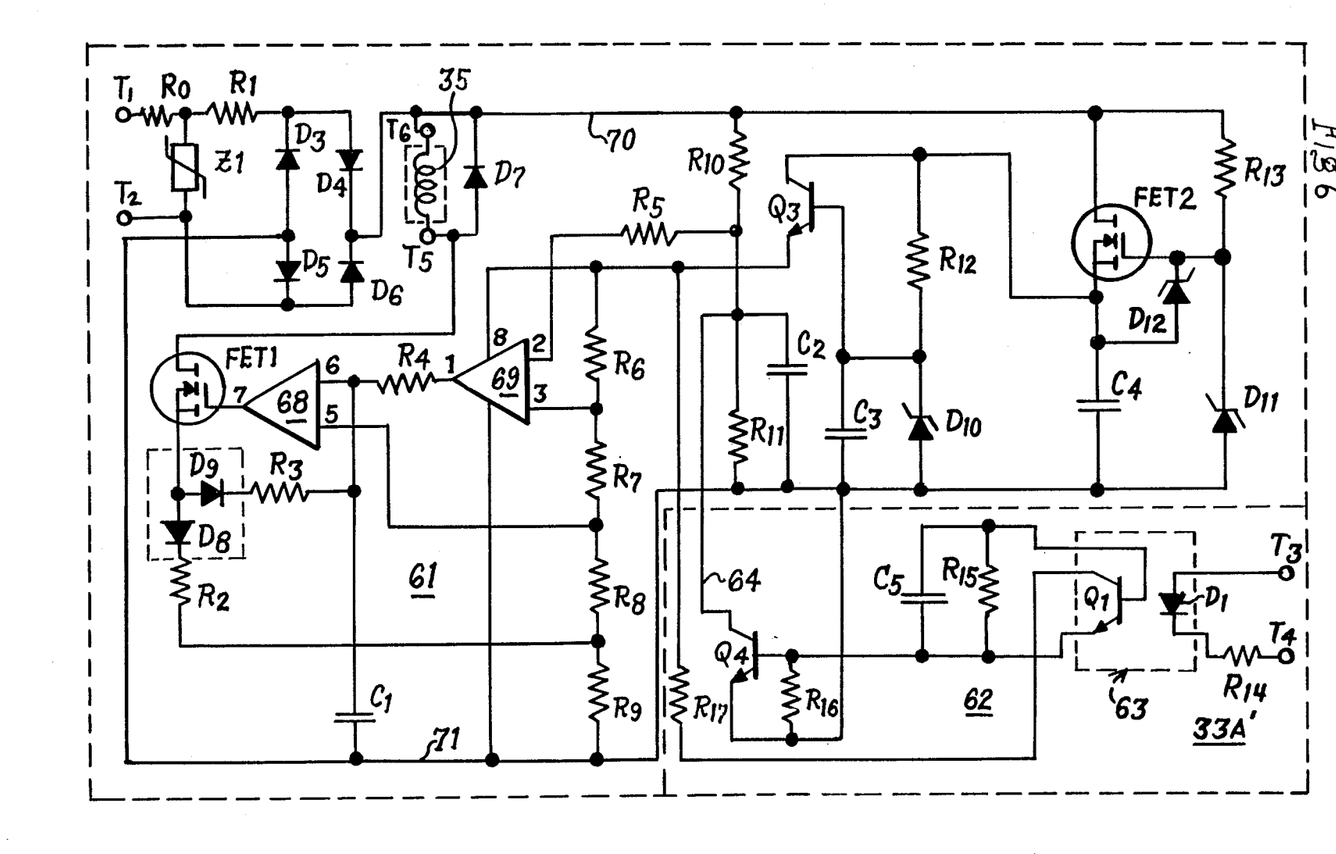
FIG. 6 is a circuit diagram of the components within the circuit of FIG. 4.

The operation of the undervoltage control circuit 61 is best seen by referring now to the detailed circuit 33A' depicted in FIG. 6. The undervoltage control circuit 61 disables the actuator-accessory coil 35 which is connected within the circuit by means of terminals $T_5$, $T_6$ the voltage across terminals T1, T2, falls below a predetermined value for a predetermined time. An external voltage source (not shown) is applied to terminals T1, T2 via conductors 34 (FIG. 4) thereby providing current through the current limiting resistors $R_0$, $R_1$ and the rectifier consisting of diodes $D_3$–$D_6$. One output of the rectifier connects with the positive bus 70 and the other output of the rectifier connects with the negative bus 71. A varistor $Z_1$ is connected across the terminals through resistor $R_0$ to protect the undervoltage control circuit from voltage surges. The actuator-accessory coil 35 is connected between the positive bus and the drain terminal of an $FET_1$, the source of the $FET_1$ connects with the negative bus through diode $D_8$, and resistors $R_2$, $R_9$. A fly-back diode $D_7$ is used to circulate current back through the undervoltage accessory coil when the $FET_1$ is turned off. Output pin 7 of a comparator 68 connects with the gate of the $FET_1$ and input pin 6 of the comparator connects with the source of $FET_1$ through resistor $R_3$ and diode $D_9$. The input pin 6 connects with the negative bus through capacitor $C_1$. The input pin 5 to the comparator connects to the midpoint of the test voltage divider consisting of resistors $R_6$–$R_9$. The chopper circuit, consisting essentially of the $FET_1$ and the comparator, controls the current to the actuator-accessory coil 35 in the following manner. With the $FET_1$ in its "OFF" state, input pin 5 to the comparator is set at 2 volts at the junction of resistors $R_7$ and $R_8$. When the voltage across capacitor $C_1$ is less than 2 volts, the output pin 7 of the comparator is "high", turning on the $FET_1$ and allowing holding current to flow through the actuator-accessory coil 35. When the $FET_1$ is on, the circuit current through diode $D_8$, develops a proportional voltage across $R_2$ and $R_9$. Capacitor $C_1$ charges to this voltage through diode $D_9$ and resistor $R_3$. Diode $D_8$, in series with resistor $R_2$, provides both voltage and temperature compensation for diode $D_9$ while resistor $R_3$ provides a short time delay during the charging cycle for capacitor $C_1$ so that the comparator does not turn off prematurely due to the occurrence of a current spike during reverse recovery of diode $D_7$. For selected values of $R_2$ and $R_9$ at 30 milliamps circuit current, the voltage developed across $R_2$ and $R_9$ is approximately 3 volts. The voltage across $R_9$ adds to the voltage across $R_8$ to bias input pin 5 of the comparator 68 at approximately 3 volts. When the circuit current exceeds 30 milliamps, capacitor $C_1$ will charge greater than 3 volts driving the output pin 7 of the comparator to a "low" state, thereby turning off the $FET_1$. With the $FET_1$ off, the voltage on input pin 5 reverts back to the 2 volt reference value. With 3 volts across capacitor $C_1$ the output of the comparator cannot go "high" until the voltage across $C_1$ drops to less than 2 volts. $C_1$ can only discharge through resistor $R_4$ which connects the output pin 1 of a second comparator 69, which is "low". The value of resistor $R_4$ is selected to provide a fixed time delay for the capacitor $C_1$ to decay to 2 volts thereby establishing a fixed off-time for the $FET_1$. The circuit current through the undervoltage accessory coil is arranged to turn off at approximately 30 milliamps. Diode $D_7$ then circulates the energy stored in the inductance of the actuator-accessory coil in order to maintain the current at a sufficiently high value to prevent the plunger spring 41, in FIG. 2, from propelling the plunger 36 in the forward direction. The circuit current through the actuator-accessory coil decays to approximately 20 milliamps after a predetermined time delay which is determined by the inductive and resistive properties of the actuator-accessory coil. The resistor $R_4$ is selected to discharge capacitor $C_1$ 3 volts to 2 volts in the same predetermined time delay. After the predetermined time delay, the output pin 7 of comparator 68 goes "high" causing the process just described to repeat itself. If the voltage applied to terminals T1, T2 should at any time drop below a predetermined value, the output pin 1 of the second comparator 69 will go "high" thereby charging the capacitor $C_1$ up to the positive rail voltage of the second comparator, which in turn, drives the output pin 7 of comparator 68 "low" to turn off the $FET_1$. When the voltage across terminals $T_1$, $T_2$, increases, the output pin 1 of the second comparator is "low" causing the capacitor $C_1$ to discharge through resistor $R_4$. As soon as the voltage across capacitor $C_1$ decays to 2 volts, $FET_1$ turns on and the process described earlier is repeated. Resistors $R_{10}$, $R_{11}$ connecting across the positive and negative busses 70, 71 in combination with the second capacitor $C_2$, connecting across $R_{11}$, form a simple averaging circuit producing an approximately constant output voltage across $C_2$. The voltage value across $C_2$ determines the voltage value above which circuit current is applied to the actuator-accessory coil which value i defined herein as the "pick-up" value and below which, current to the actuator-accessory coil will be interrupted, which is defined herein as the "drop-out" value. In operation, the average voltage established across capacitor $C_2$ is applied to the input pin 2 of the second comparator 69 through a current limiting resistor $R_5$. The current limiting resistor $R_5$ limits the current into the input pin 2 when the voltage across $C_2$ exceeds the positive rail voltage applied to the second comparator 69 at pin 8. Input pin 3 of the second comparator is set at approximately 7 volts by the reference voltage divider R6-R9 which determines the voltage appearing at the connection point between $R_6$ and $R_7$. When the voltage across capacitor $C_2$ is below 7 volts, the output pin 1 of the second comparator 69 goes "high" causing the first comparator 68 to interrupt the current to the actuator-accessory coil. Conversely, when the voltage across $C_2$ is greater than 7 volts, the output pin 1 of the second comparator is "low" thereby permitting comparator 68 to apply turn-on voltage to the gate electrode of the $FET_1$ which will apply current to the actuator-accessory coil. Resistor $R_{12}$, zener diode $D_{10}$, transistor $Q_3$ and capacitor $C_3$ serve to regulate the voltage at the emitter of $Q_3$ in the following manner. Resistor $R_{12}$ and zener diode $D_8$ establish a reference voltage for the base of $Q_3$ which in turn, supplies a regulated output voltage to the emitter of $Q_3$ which is applied to the junction of pin 8 on the second comparator 69 and to resistor $R_6$. Resistor $R_{12}$ and the collector of $Q_3$ ar connected to one side of a storage capacitor $C_4$. The undervoltage control circuit 61 requires a relatively low level of steady current, in the order of 1 milliampere, to maintain operation of the discrete electronic devices such as $FET_1$, comparators 68, 69 and transistor $Q_3$. A higher level of current, in the order of 30 milliamps, is applied to the actuator-accessory coil to generate sufficient magnetic flux to hold the plunger 36 of FIG. 2 against the charged plunger spring 41. The 30 milliampere current to the actuator-accessory coil must be maintained while the AC voltage applied to terminals T1, T2 passes through its zero crossing on each half of the AC cycle. This is accomplished by the combination of $FET_2$ with resistor $R_{13}$ and the storage capacitor $C_4$. Resistor $R_{13}$, in series with zener diode $D_{11}$, establishes a 33 volt gate reference voltage at the drain electrode of the $FET_2$ which sets a charge level of 30 volts for the storage capacitor $C_4$. When capacitor $C_4$ is less than 30 volts and the AC voltage applied to terminals T1, T2 is greater than 30 volts, the gate electrode of $FET_2$ is positive with respect to the source electrode such that $FET_2$ applies charging current to the storage capacitor $C_4$. As $C_4$ approaches 30 volts, $FET_2$ turns off to apply the low level steady current requirements described earlier. Accordingly, zener diode $D_{12}$ protects the gate of $FET_2$ from overvoltage conditions in the event that the AC voltage is applied to terminals T1, T2 when the capacitor $C_4$ is completely discharged. With capacitor $C_4$ fully charged, high ambient temperatures would otherwise cause leakage current in the $FET_2$ to further charge the capacitor in excess of the rated value of the capacitor. The zener diode $D_{12}$ functions to limit the voltage applied to the storage capacitor $C_4$ to one diode-voltage above the voltage across the zener diode $D_{11}$. Zener diode $D_{12}$ accordingly supplies a negative voltage to the gate electrode of the $FET_2$ to reduce the $FET_2$ leakage current and thereby protect the storage capacitor $C_4$ from excess voltage. As described earlier, the storage capacitor $C_4$ also provides energy to the actuator-accessory coil when the voltage applied to terminals T1, T2 drops below the 30 volt level. The discharge path for the storage capacitor $C_4$ comprises the internal source-drain diode of $FET_2$, the actuator-accessory coil, $FET_1$, diode $D_8$ and resistors $R_2$, $R_9$.

As described in the aforementioned U.S. patent application Ser. No. 133,869, the undervoltage control circuit 61 is preferred over conventional RC energy storage circuits because of its low power dissipation at high input voltages which thereby allows the beneficial use of smaller-sized and lower-rated storage capacitors.

The low power dissipation is provided by the $FET_2$ in circuit with the storage capacitor $C_4$, whereby capacitor $C_4$ is charged through operation of $FET_2$ only during the rising part of the wave form of the AC voltage applied across input terminals T1, T2, typically between 30–80 volts. The $FET_2$ remains off until the voltage again drops to less than 30 volts. Since the peak voltage appearing across the input terminals T1, T2 can exceed 350 volt, charging the storage capacitor $C_4$ at the lower voltage level is thus seen to be an important feature for providing the low power dissipation.

The operation of the overcurrent control circuit 62 within the circuit 33A' of FIG. 6 operates in the following manner. When a trip signal is applied to terminals T3, T4 which terminals comprise the edge connectors 59 on the actuator-accessory printed wire board 33 which connects with pins 30 on the trip unit printed wire board 27 as discussed earlier with reference to FIGS. 2 and 4, current flows through the light-emitting diode $D_1$ in the opto-isolator 63 and through the current limiting resistor $R_{14}$. The phototransistor $Q_1$ in the opto-isolator becomes conductive and thereby transfers current through resistor $R_{17}$ from the emitter of transistor $Q_3$ in the undervoltage control circuit 61 which is the source of the control voltage to the second comparator 69, as described earlier. When $Q_1$ becomes conductive, current also flows through resistor $R_{16}$ to the base-emitter junction of transistor $Q_4$ which turns on $Q_4$ thereby discharging capacitor $C_2$ within the undervoltage control circuit which connects with $Q_4$ by means of conductor 64. The discharge of $C_2$, which provides the test voltage to the second comparator 69, simulates an undervoltage condition thereby interrupting the holding current supplied to the actuator-accessory coil 35 in the manner described earlier. The parallel combination of resistor $R_{15}$ and capacitor $C_5$ connected across the emitter and base of the phototransistor $Q_1$ prevent the phototransistor from falsely becoming conductive by electrical environmental noise.

Figure 5:
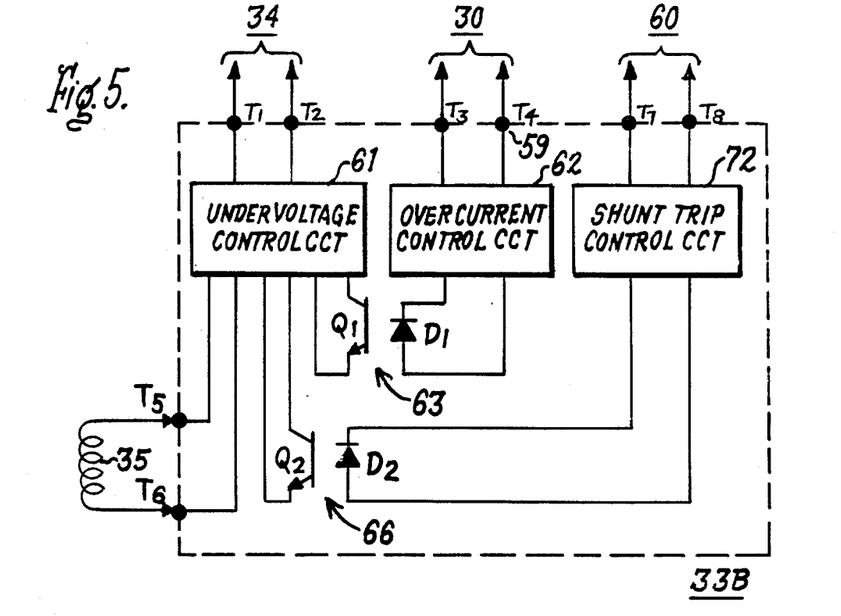
FIG. 5 is a circuit diagram of an additional embodiment of the electric circuit contained within the printed wire board on the combined actuator-accessory module of FIG. 2.

Undervoltage release function, overcurrent protection and shunt trip facility is provided by means of circuit 33B depicted in FIG. 5 which circuit is incorporated within the actuator-accessory printed wire board 33 of FIGS. 2 and 3. The undervoltage control circuit 61 operates to interrupt circuit current by interrupting the holding current to the actuator-accesory coil 35 in the manner described earlier with reference to FIGS. 4 and 6. The overcurrent control circuit 62 also interacts with the undervoltage control circuit by means of opto-isolator 63 in the manner described earlier. The shunt trip control circuit 72 connects with external wire conductors 60 by means of terminals T7, T8 and interacts with the undervoltage control circuit 61 by means of opto-isolator 66. To institute a shunt trip operation, the light-emitting diode $D_2$ is energized, which turns on the phototransistor $Q_2$, in the same manner described earlier for the light-emitting diode $D_1$ and phototransistor $Q_1$ within the opto-isolator 63.

The use of a combined undervoltage release, overcurrent and shunt trip circuit was heretofore impractical because of the electric isolation problems involved with the individual circuits. For example, the voltage signal applied to perform a shunt trip function could evolve from a different source from that of the undervoltage control circuit thereby requiring electrical isolation between the two circuits. The use of opto-isolators between the shunt trip and undervoltage circuits provides such electrical isolation without undue cost and complex circuitry. This is also true for the overcurrent control circuit which is generally fed from a voltage source other than the one used with the undervoltage and shunt trip control circuits.

Figure 7:
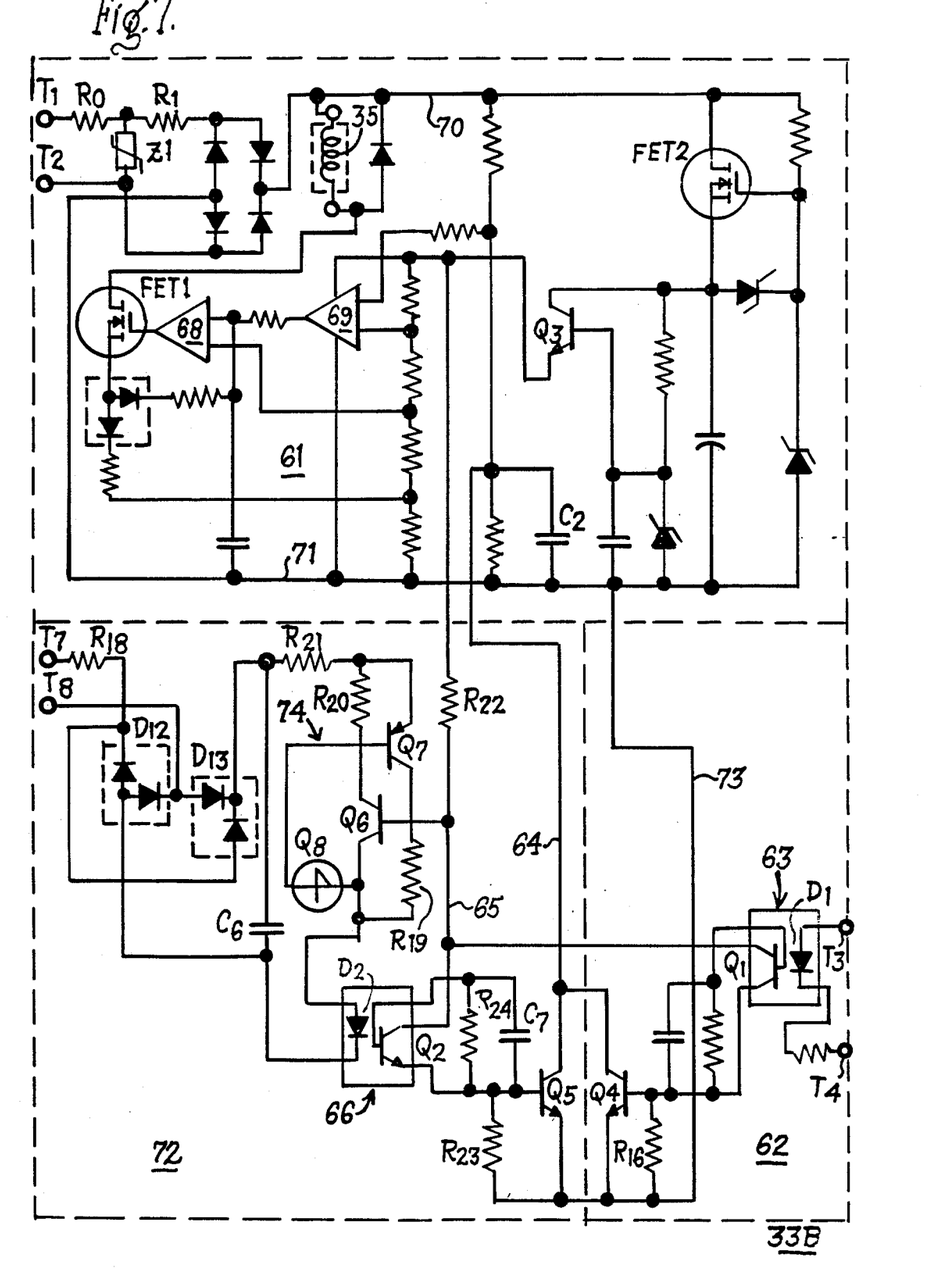
FIG. 7 is a circuit diagram of the components within the circuit diagram of FIG. 5.

The operation of the overcurrent, undervoltage and shunt trip circuits of FIG. 33B can best be seen by referring now to the detailed circuit 33B' depicted in FIG. 7. The undervoltage control circuit 61 and over current control circuit 62 .operate in the same manner as described earlier with reference to FIGS. 4 and 6. The operation of the shunt trip control circuit 72 is seen as follows. A trip signal is applied over external wire conductors 60 (FIG. 5) to terminals T7, T8 which connect through current limiting resistor $R_{18}$ and diode pairs $D_{12}$, $D_{13}$ to a storage capacitor $C_6$. Transistors $Q_6$, $Q_7$, silicon switch $Q_8$ and resistors $R_{19}$ and $R_{20}$ are connected together to form an electronic switch 74. The voltage developed across capacitor $C_6$ is applied to one side of the electronic switch through a current limiting resistor $R_{21}$ and to the other side thereof through the light-emitting diode $D_2$ of the opto-isolator 66. When the voltage across the silicon switch $Q_8$ exceeds its rated break-over voltage, it becomes conductive thereby drawing current through resistor $R_{20}$ and the emitter-base junction of transistor $Q_7$ causing $Q_7$ to become conductive. With $Q_7$ conducting, current is applied to the base-emitter junction of transistor $Q_6$ and resistor $R_{19}$ such that $Q_6$ also becomes conductive. With $Q_6$ conductive, silicon switch $Q_8$ turns off and $Q_6$ forces more current to flow through transistor $Q_7$ causing light-emitting diode $D_2$ to turn on. The phototransistor $Q_2$ then becomes conductive causing current to flow through the undervoltage control circuit 61 by means of conductor 65 and current limiting resistor $R_{22}$ to the base-emitter junction of transistor $Q_5$. $Q_5$ turns on and discharges capacitor $C_2$ which now appears to the input of comparator 69 as an undervoltage condition thereby turning off the holding current to the actuator-accessory coil 35 in the manner described earlier. Control power is returned to tee '35 overcurrent control circuit 62 by means of conductor 73 which connects with the negative bus 71 a one end and to the base of the transistor $Q_4$ through current limiting resistor $R_{16}$ at an opposite end. Control power is returned to the shunt trip control circuit 72 by means of conductor 73 and current limiting resistor $R_{23}$ which connects with the base of transistor $Q_5$. Capacitor $C_7$ and resistor $R_{24}$ connect across the base and emitter of phototransistor $Q_2$ to prevent the phototransistor from becoming falsely rendered conductor by electrical environment noise. The overcurrent control circuit 62 which connects with the undervoltage control circuit through transistor $Q_4$ and conductor 64 operates in the same manner to de-energize the actuator-accessory coil 35, as described earlier with reference to FIG. 6.

The arrangement of the components within the above described electronic switch 74 is an important feature of the invention. Specifically, the electronic switch minimizes heating effects caused by current flow through the shunt trip control circuit. The value of the current limiting resistor $R_{18}$ is selected to allow rapid charging of the storage capacitor $C_6$ while at the same time providing a holding current for the electronic switch which is above the charging current provided to the storage capacitor. This insures that the electronic switch does not remain in a latched-on condition after the storage capacitor has discharged.

Heretofore, when a circuit breaker was installed with a shunt trip device to articulate the circuit breaker operating mechanism and separate the circuit breaker contacts, some additional means was also required to turn off the remote shunt trip current in order to protect the electromagnetic coil used within the shunt trip device. An auxiliary switch such as described in aforementioned U.S. patent application Ser. No. 133,867 mechanically interacted with the circuit breaker operating mechanism to interrupt the shunt trip current flow to the shunt trip electromagnetic coil. The shunt trip control circuit 72 shown in FIG. 7 automatically controls the shunt trip control current by operation of the electronic switch thereby permitting continuous energization of the shunt trip accessory function without requiring an auxiliary switch.

A modular actuator-accessory arrangement has herein been described which allows selected accessory function to be either field-installed or factory-installed by means of selected actuator-accessory modules. The actuator-accessory module completely contains the mechanical components required to interface with the associated circuit breaker mechanism to articulate the circuit breaker operating mechanism along with the electronic logic required for each selected protection facility within a single module entity.

Having thus described my invention, what I claim as new and desire to secure by Letters Patent is:

1. A circuit breaker actuator-accessory module circuit comprising:
   an undervoltage release electromagnetic coil;
   a spring-biased plunger associated with said coil;
   an undervoltage control circuit connected with said coil, said undervoltage circuit including means for interrupting holding current to said coil and allowing said plunger to propel into contact with a trip lever upon receipt of a predetermined undervoltage signal to said undervoltage circuit; and
   an overcurrent control circuit interacting with said undervoltage circuit through an opto-isolator said overcurrent circuit including means for interrupting said holding current upon receipt of a predetermined overcurrent signal to said overcurrent circuit.

2. The actuator-accessory module circuit of claim 1 wherein said opto-isolator includes a phototransistor connected with said undervoltage circuit through a first transistor switch and a light-emitting diode connected with a first pair of input terminals to said overcurrent circuit for receiving said overcurrent signal.

3. The actuator-accessory module circuit of claim 2 wherein said undervoltage circuit means includes a first comparator connected with said electromagnetic coil through a first FET.

4. The actuator-accessory module circuit of claim 3 including a second FET connected with said first comparator through a second comparator and a second transistor switch.

5. The actuator-accessory module circuit of claim 4 wherein the base and emitter on said first transistor switch connects with the emitter on said phototransistor.

6. The actuator-accessory module circuit of claim 5 wherein the collector on said first transistor switch connects with test voltage means which connect with a first input to said second comparator.

7. The actuator-accessory module circuit of claim 6 wherein said undervoltage circuit means includes a second pair of input terminals connecting with a diode bridge rectifier for receiving said undervoltage signal, a first output from said rectifier connecting with one side of said electromagnetic coil, a second output from said rectifier connecting with said emitter on said first transistor switch.

8. The actuator-accessory module circuit of claim 7 including a zener diode connected between the source terminal and the gate terminal of said second FET.

9. The actuator-accessory module circuit of claim 8 wherein the source terminal on said first FET connects with a first input to said first comparator and with an output from said second comparator, the drain terminal on said first FET connects with the other side of said electromagnetic coil.

10. The actuator-accessory module circuit of claim 6 wherein said test voltage means comprises a first voltage divider.

11. The actuator-accessory module circuit of claim 10 wherein said first voltage divider comprises a first pair of resistors connected between a negative voltage supply bus and a positive voltage supply bus.

12. The actuator-accessory module circuit of claim 10 wherein a second input to said first comparator and a second input to said second comparator connect with reference voltage means.

13. The actuator-accessory module circuit of claim 12 wherein said reference voltage means comprises a second voltage divider.

14. The actuator-accessory module circuit of claim 13 wherein said second voltage divider comprises a second and third pair of resistors connecting between the emitter of the second transistor switch and the negative voltage supply bus.

15. The actuator-accessory module circuit of claim 14 wherein said second pair of resistors connect with the second input to said first comparator.

16. The actuator accessory module circuit of claim 14 wherein said third pair of resistors connect with said second input to said second comparator.

17. A circuit breaker actuator-accessory module circuit comprising:
   an undervoltage release electromagnetic coil;
   a spring-biased plunger associated with said coil;
   an undervoltage control circuit connected with said coil, said undervoltage circuit including means for interrupting holding current to said coil and allowing said plunger to propel into contact with a trip lever upon receipt of a predetermined undervoltage signal to said undervoltage circuit;

an overcurrent control circuit interacting with said undervoltage circuit through a first opto-isolator, said overcurrent circuit including means to interrupt said holding current upon receipt of a predetermined overcurrent signal; and a shunt trip control circuit interacting with said undervoltage circuit through a second opto-isolator, said shunt trip circuit including means to interrupt said holding current upon receipt of an external command signal.

18. The circuit breaker actuator-accessory module circuit of claim 17 wherein said first opto-isolator includes a first phototransistor connected with said undervoltage circuit through a first transistor switch and a first light-emitting diode connected with a first pair of input terminals to said overcurrent circuit for receiving said overcurrent signal.

19. The circuit breaker actuator-accessory module circuit of claim 18 wherein said second opto-isolator includes a second phototransistor connected with said undervoltage circuit through a second transistor switch and a second light-emitting diode connected with said shunt trip circuit.

20. The circuit breaker actuator-accessory module circuit of claim 19 wherein said undervoltage circuit means includes a first comparator connected with said electromagnetic coil through a first FET.

21. The circuit breaker actuator-accessory module circuit of claim 20 including a second FET connected with said first comparator through a second comparator and a third transistor switch.

22. The circuit breaker actuator-accessory module circuit of claim 21 wherein the base and emitter on said first transistor switch connects with the emitter on said first phototransistor.

23. The circuit breaker actuator-accessory module circuit of claim 22 wherein the collector on said first transistor switch connects with test voltage means which connect with an input to said second comparator.

24. The circuit breaker actuator-accessory module circuit of claim 23 wherein said undervoltage circuit means includes a second pair of input terminals connecting with a diode rectifier for receiving said undervoltage signal, a first output from said rectifier connecting with one side of said electromagnetic coil, a second output from said rectifier connecting with said emitter on said first transistor switch.

25. The circuit breaker actuator-accessory module circuit of claim 24 including zener diode connected between the source terminal and the gate terminal of said second FET.

26. The circuit breaker actuator-accessory module circuit of claim 25 wherein the source terminal on said first FET connects with a first input to said first comparator and with an output from said second comparator, the drain terminal on said first FET connects with the other side of said electromagnetic coil.

27. The circuit breaker actuator-accessory module circuit of claim 26 wherein said overcurrent means includes a second pair of terminals connected with said first light-emitting diode for receiving said overcurrent signal.

28. The circuit breaker actuator-accessory module circuit of claim 27 wherein said shunt trip circuit means includes a third pair of terminals for receiving said external command signal.

29. The circuit breaker actuator-accessory module circuit of claim 28 including a storage capacitor connecting with said third pair of terminals through a second signal bridge diode rectifier.

30. The circuit breaker actuator-accessory module circuit of claim 29 including an electronic switch connecting between said storage capacitor and said second light-emitting diode for regulating said external command signal.

31. The circuit breaker actuator-accessory module circuit of claim 30 wherein said electronic switch includes a fourth transistor switch connected in series with said second light-emitting diode through a first resistor.

32. The circuit breaker actuator-accessory module circuit of claim 31 including a fifth transistor switch within said electronic switch, said fourth transistor switch being connected in series with said second light-emitting diode.

33. The circuit breaker actuator-accessory module circuit of claim 32 including a silicon switch connecting between the base of said fourth transistor switch and the emitter of said fifth transistor switch.

34. The circuit breaker actuator-accessory module circuit of claim 33 wherein said test voltage means comprises a first voltage divider.

35. The circuit breaker actuator-accessory module circuit of claim 34 wherein said first voltage divider comprises a first pair of resistors connected between a negative voltage supply bus and a positive voltage supply bus.

36. The circuit breaker actuator-accessory module circuit of claim 35 wherein a second input to said first comparator and a second input to said second comparator connect with reference voltage means.

37. The circuit breaker actuator-accessory module circuit of claim 36 wherein said reference voltage means comprises a second voltage divider.

38. The circuit breaker actuator-accessory module circuit of claim 37 wherein said second voltage divider comprises a second and third pair of resistors connecting between the emitter of the second transistor switch and the negative voltage supply bus.

39. The circuit breaker actuator-accessory module circuit of claim 38 wherein said second pair of resistors connect with the second input to said first comparator.

40. The circuit breaker actuator-accessory module circuit of claim 39 wherein said third pair of resistors connect with said second input to said second comparator.

* * * * *